United States Patent [19]
Stroszynski et al.

[11] Patent Number: 5,095,930
[45] Date of Patent: Mar. 17, 1992

[54] PROCESS FOR THE UNIFORM INTRODUCTION OF A FLUID, AND APPARATUS FOR CARRYING OUT THE PROCESS

[75] Inventors: Joachim Stroszynski, Wiesbaden; Herbert Zeisel, Bad Honnef; Franz Durst, Langensendelbach; Raimund Haas, Frankfurt am Main; Werner Interthal, Ruesselsheim; Peter Lehmann, Kelkheim; Gerhard Mack, Walluf; Manfred Dammann, Hohenstein, all of Fed. Rep. of Germany

[73] Assignee: Hoechst Aktiengesellschaft, Frankfurt am Main, Fed. Rep. of Germany

[21] Appl. No.: 690,571

[22] Filed: Apr. 24, 1991

Related U.S. Application Data

[62] Division of Ser. No. 512,276, Apr. 20, 1990, Pat. No. 5,029,598.

[30] Foreign Application Priority Data

Apr. 21, 1989 [DE] Fed. Rep. of Germany ....... 3913132

[51] Int. Cl.$^5$ .............................................. B05B 1/14
[52] U.S. Cl. ................................. 137/1; 137/561 A; 239/553.3
[58] Field of Search ............... 137/1, 561 R, 561 A; 239/553.3, 553.5

[56] References Cited

U.S. PATENT DOCUMENTS

| | | | |
|---|---|---|---|
| 3,037,629 | 6/1962 | Fontein et al. | 137/561 R X |
| 3,103,942 | 9/1963 | Sharp | 137/561 R X |
| 3,736,955 | 6/1973 | Schlesser | 137/561 X |
| 3,794,056 | 2/1974 | Warren | 137/561 A |
| 3,907,210 | 9/1975 | Dow, Jr. et al. | 239/553.3 |
| 4,016,033 | 4/1977 | Schiel et al. | 137/561 A X |
| 4,333,629 | 6/1982 | Roy | 137/561 A X |
| 4,578,248 | 3/1986 | Nagaoka | 239/553 S X |
| 4,609,009 | 9/1986 | Tisone | 137/561 A |
| 4,782,857 | 11/1988 | Bieri | 137/561 A |
| 4,809,744 | 3/1989 | Bhat | 137/561 A |

FOREIGN PATENT DOCUMENTS

| | | | |
|---|---|---|---|
| 3106822 | 10/1982 | Fed. Rep. of Germany | 137/561 A |
| 18745 | of 1896 | United Kingdom | 137/561 A |

*Primary Examiner*—John Rivell
*Attorney, Agent, or Firm*—Foley & Lardner

[57] ABSTRACT

A distributor tube has tube slots in its shell surface transversely of the inflow direction of a fluid into the distributor tube. A casing tube is enclosed by the distributor tube and is divided into flow chambers, each of which is bounded by two annular plates and connected to an inlet sector. A star-shaped volume flow divider is located on the inlet side of the distributor tube as a tube insert, which divides the introduced mass flow rate into partial flow rates for the flow chambers. In another embodiment, the distributor tube encloses a rotationally symmetric pressure distributor, whereby the fluid within the distributor tube encounters equal pressure in the radial and axial flow directions over the inlet length of the distributor tube.

17 Claims, 4 Drawing Sheets

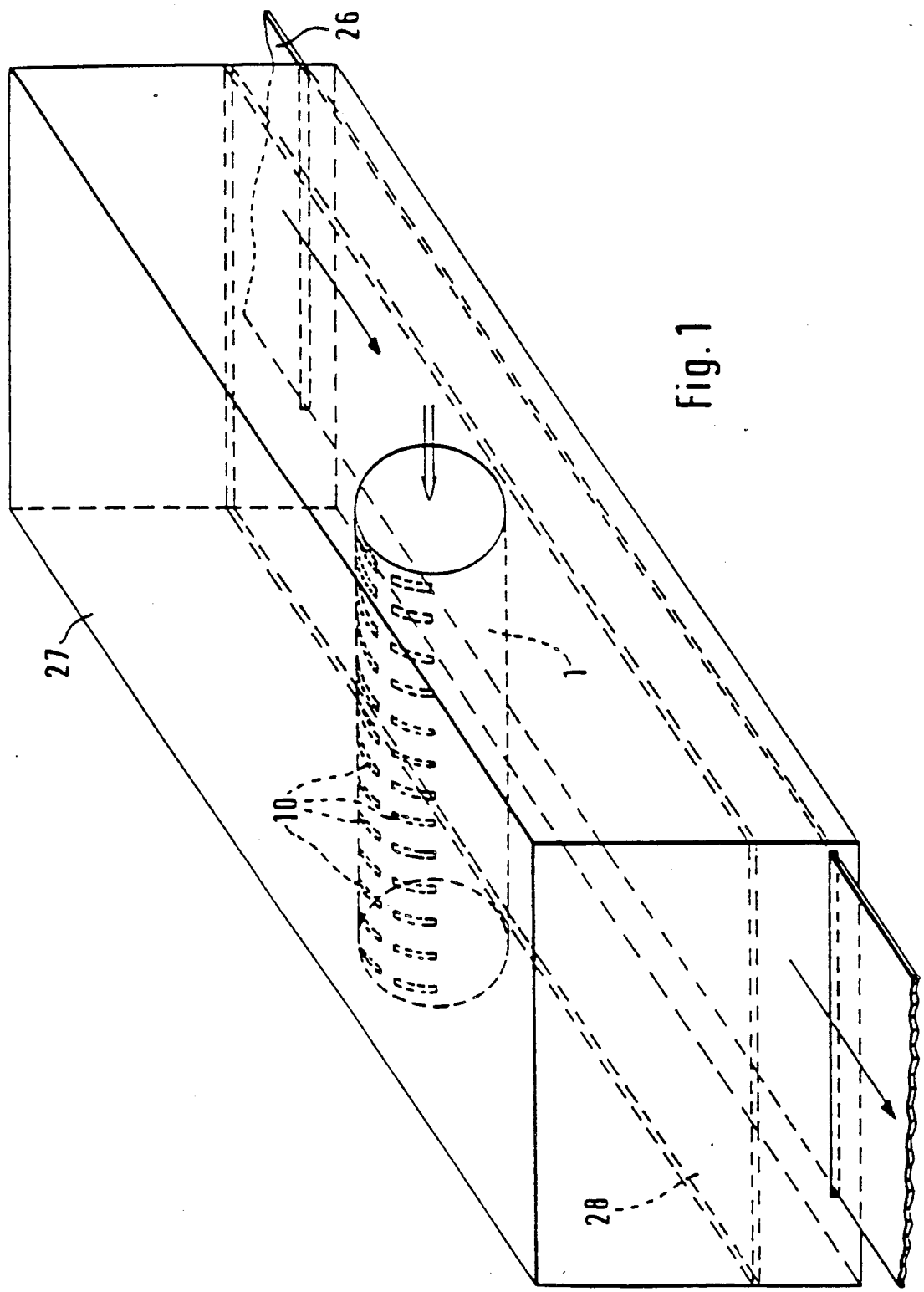

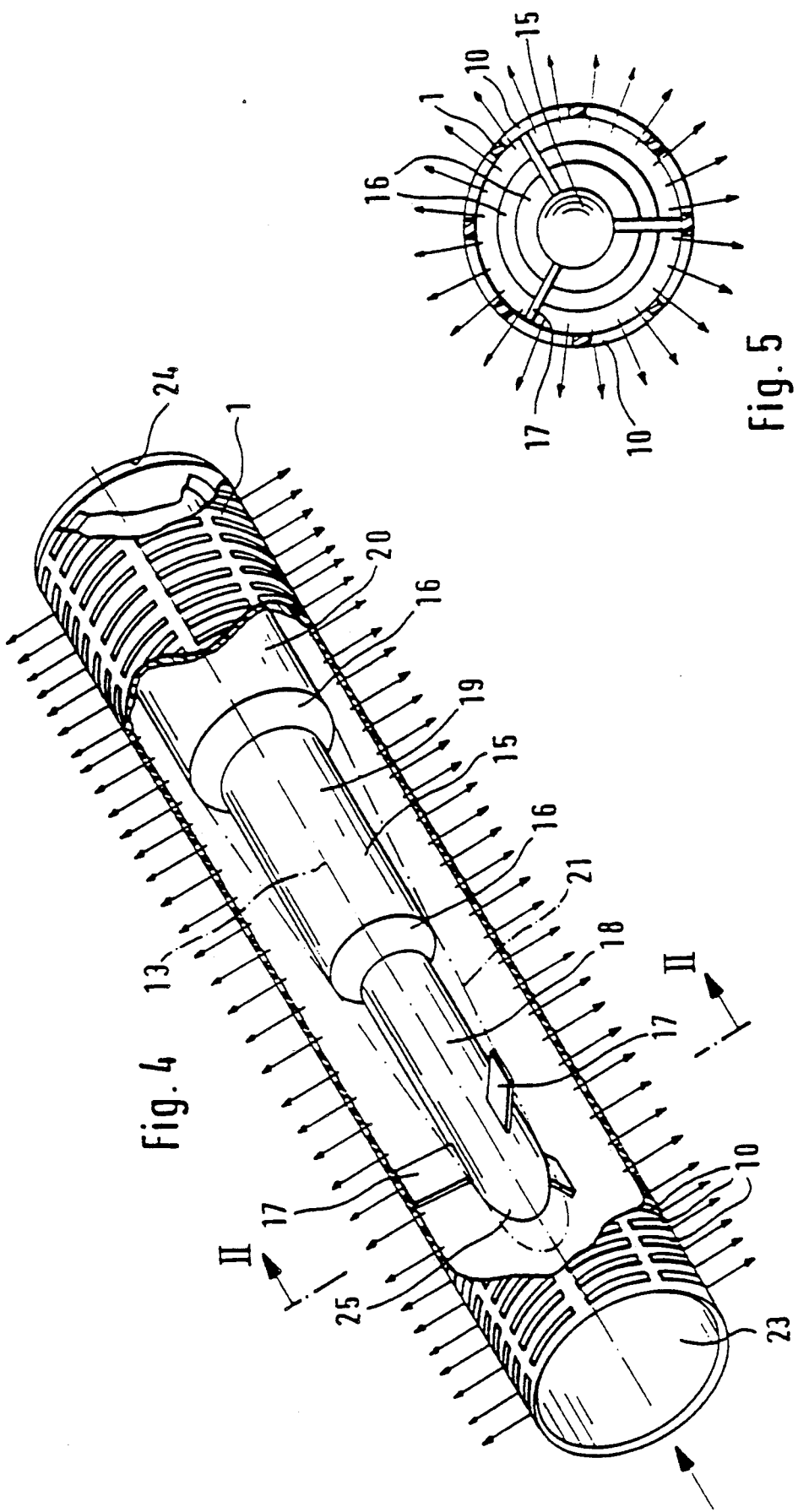

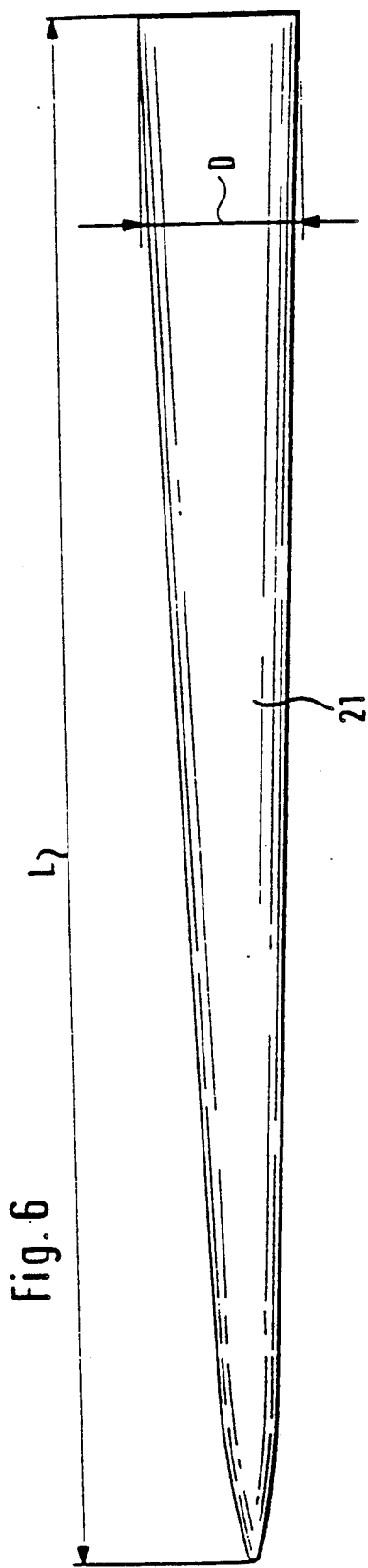

PROCESS FOR THE UNIFORM INTRODUCTION OF A FLUID, AND APPARATUS FOR CARRYING OUT THE PROCESS

This application is a division of application Ser. No. 512,276, filed Apr. 20, 1990, now U.S. Pat. No. 5,029,598.

BACKGROUND OF THE INVENTION

The invention relates to a process for the uniform introduction of a fluid into a fluid bath by means of a distributor tube which is perforated over its shell surface, and also to an apparatus for carrying out the process.

The fluid concerned can be a liquid or a gas. In particular, the process permits the uniform introduction of liquids of all kinds, such as, for example, of electrolyte solutions into electrochemically operating web processing plants for the production of pretreated aluminum webs, from which supports for offset printing plates are made.

SUMMARY OF THE INVENTION

It is an object of the present invention to provide a process for the uniform introduction of a liquid, in particular an electrolyte solution, or another fluid, into a corresponding bath through which a web-shaped material to be roughened is transported.

Another object of the present invention is to provide an apparatus for carrying out the foregoing process.

In accomplishing the foregoing objectives, there has been provided, in accordance with one aspect of the present invention, a process for the uniform introduction of a fluid into a fluid bath by means of a distributor tube which is perforated over its shell surface, wherein the total mass flow rate of the fluid is divided into partial mass flow rates on entry into the distributor tube and is guided longitudinally of the tube axis and over the periphery of the distributor tube such that a uniformly outflowing volume flow is set up transversely of the tube axis.

In accordance with another aspect of the present invention, there is provided a process for the uniform introduction of a fluid into a fluid bath by means of a distributor tube as described above, wherein the flow within the distributor tube encounters equal pressure conditions in the axial and radial flow directions over the inlet length of the distributor tube.

In accordance with yet another aspect of the present invention, there is provided an apparatus for carrying out the foregoing process which comprises a distributor tube perforated over its shell surface, wherein the perforated distributor tube encloses a casing tube which is divided into flow chambers, and wherein each flow chamber is bounded by two annular plates and is connected to an inlet sector, and wherein a volume flow divider is arranged on the inlet side of the distributor tube as a tube insert which divides the introduced mass flow rate into partial mass flow rates for the flow chambers.

In accordance with a further object of the present invention there is provided an apparatus for carrying out the inventive process which comprises a perforated distributor tube which encloses a rotationally symmetrical pressure distributor which is centered by ribs in a star shape in the distributor tube, has a diameter which increases from the inlet opening to the terminal end face, and joins the terminal end face.

Other objects, features and advantages of the present invention will become apparent to those skilled in the art from the following detailed description. It should be understood, however, that the detailed description and specific examples, while indicating preferred embodiments of the present invention, are given by way of illustration and not limitation. Many changes and modifications within the scope of the present invention may be made without departing from the spirit thereof, and the invention includes all such modifications.

BRIEF DESCRIPTION OF THE DRAWINGS

The invention may be more readily understood by referring to the accompanying drawing by which FIG. 1 shows schematically a distributor tube according to the invention, in an electrolyte bath container through which runs a support web to be treated, FIG. 4 shows a perspective view of another embodiment of the distributor tube, partially broken away, with a stepped pressure distributor according to the invention, FIG. 5 shows a section along the line II—II in FIG. 4, FIG. 6 shows a view of a paraboloid of revolution, which is inserted as a pressure distributor into a distributor tube, and FIG. 7 shows a view of a cone, which is used as the pressure distributor in a distributor tube.

DETAILED DESCRIPTION OF THE PREFERRED EMBODIMENTS

Figure 3:
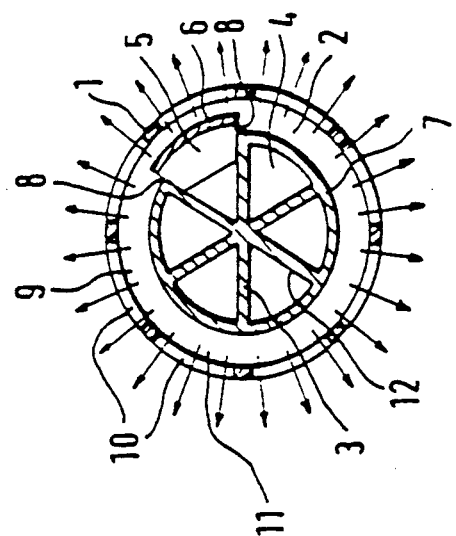
FIG. 3 shows a section along the line I—I in FIG. 2.

According to the process, uniform exit velocities of gas flows along distributor tubes can likewise be achieved.

The following description is principally concerned with the application in the case of preprocessing aluminum webs for offset printing plates. In the treatment stages of the support material for offset printing plates, the aluminum web is roughened by the action of electric current in an electrolyte solution and is subsequently anodized.

In a preferred embodiment, the partial volume flow rates are divided up along and parallel to the tube axis into equal volume rates. The flow is introduced into the distributor tube, according to the process, at one end face and the mass rate or the partial flow rates of the flow are compartmentalized at the sides of the volumes opposite to the end face and are deflected transversely of the tube axis.

In an embodiment of the process, each of the deflected partial flow rates is distributed, as regards flow, along an inlet sector and over the inner periphery of the distributor tube, before it exits from the perforations of the distributor tube.

In another embodiment of the process, the mass flow rate of the flow within the distributor tube encounters equal pressure conditions in the axial and radial flow directions over the inlet length of the distributor tube. The pressure of the flow is kept constant here over the length of the distributor tube by suitable tube inserts, which bring about a decreasing throughflow cross section of the distributor tube.

The invention provides the advantage that the electrolyte solution flows very uniformly over the width into the respective electrolyte solution bath of a treatment stage, which is of particular importance in high capacity treatment stages which require a large throughflow of electrolyte solution, in order to ensure the uniformity of the electrochemical roughening over the width of the supports.

Turning now to the drawing, in FIG. 1 there is schematically represented, in a perspective view, a container 27 for a fluid, for example for an electrolyte solution. This electrolyte solution, together with electrodes which are not shown, forms an electrolyte bath 28 in the container, through which runs, sealed at the inlet and outlet slots, a web 26 of support material for printing plates. This support web is in general a metal web for example an aluminum web, the surface of which, after a mechanical roughening, is additionally roughened electrochemically and is then anodized. A perforated distributor tube 1 is arranged in the container 27, transversely of the direction in which the web 26 runs. The electrolyte solution is introduced into the distributor tube 1 from one side and exits, for example, through tube slots 10 in the peripheral surface of the distributor tube 1. By means of the distributor tube 1, a uniform emergence or introduction of the electrolyte liquid along the distributor tube into the electrolyte bath 28 is effected, as will be described in more detail below.

The mode of operation of the distributor tube 1 will be explained with reference to introduced electrolyte liquid or liquid; however, specific trials have shown that a distributor tube of this kind can be utilized with equal success for gases, which are introduced at one side into the distributor tube and emerge, very uniformly distributed, out of the tube slots 10 along the distributor tube 1.

Figure 2:
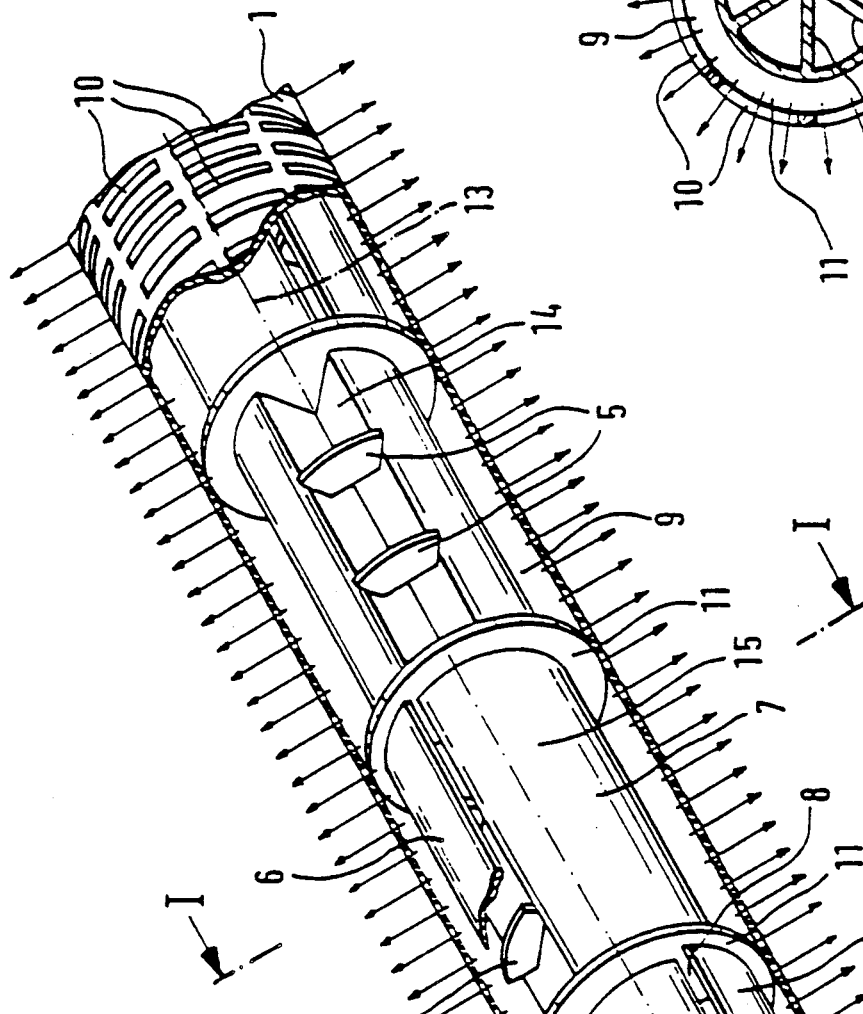
FIG. 2 shows a perspective view of an embodiment of the distributor tube according to the invention, partially broken away.

FIG. 2 shows a perspective view of a partially broken away embodiment of the distributor tube 1, which has in its peripheral surface the tube slots 10, which run transversely of the tube axis 13 in the peripheral surface of the distributor tube 1. The tube slots 10 are uniformly distributed over the peripheral surface and over the length of the distributor tube 1, which encloses a casing tube 7 which is divided into flow chambers 4. A volume flow distributor 2 is arranged as a tube insert on the inlet side of the distributor tube 1, and for example represents a six-star or eight-star tube insert with radial distributor ribs 3. The volume flow distributor divides the introduced total mass flow rate into partial flow rates, which flow into the flow chambers 4. Each of the flow chambers 4 is bounded by two annular plates 11, 11. The volume flow distributor 2 divides the cross section of the introduced mass flow rate, by means of the distributor ribs 3, into six or eight equally large individual inflow cross sections, each of which forms the inlet opening of an inlet sector 14 which leads into the associated flow chamber 4.

The volume flow distributor 2 is divided in the axial direction, i.e., along the tube axis 13, into six or eight corresponding flow chambers 4, each of which is respectively separately supplied by one of the inlet sectors 14 and which are sectionally compartmentalized by the annular plates 11.

An annular space 9 is located between the inner side of the distributor tube 1 and the casing tube 7, and is divided by the annular plates 11 into six or eight individual annular spaces. Each flow chamber 4 has a baffle plate 6 which extends along, and parallel to, the tube axis 13 over the inlet sector 14, and forms, with chamber walls 12, 12 of the inlet sector 14, two mutually parallel exit slots 8 of the flow chamber 4. The flow chambers 4 are oriented with their exit slots 8, which open into the annular space 9, towards the distributor tube 1, and respectively have two support faces 5 transversely of the flow direction and on which the baffle plate 6 is supported. The support faces 5, which partially narrow the flow cross section of the sector-shaped flow chamber 4, effect a local flow distribution along the flow chamber and at the same time support the baffle plate 6, which is fitted above the exit slots 8. The exit of the fluid from the flow chamber 4, whether an electrolyte solution or a gas is concerned, takes place through the exit slots 8 on both sides, in the peripheral direction of the casing tube 7.

In the sectional representation of FIG. 3 along the line I—I of the embodiment according to FIG. 2, it can be seen that the two support surfaces 5 are arranged transversely of the flow direction and stand out over the peripheral surface of the casing tube 7, so that the two exit slots 8, 8 open between the baffle plate 6 and the chamber walls 12 of a flow chamber 4. The exit slots 8 release the flow in a tangential direction. The flow is uniformly distributed over the periphery of the casing tube 7 in the annular space 9 between the distributor tube 1 and the casing tube 7, with the exception of the dead space behind the baffle plate 6. Although this is not shown in FIGS. 2 and 3, the baffle plate 6 can be made perforated, so that the dead space referred to is thus eliminated and even in this region a flow over the periphery of the baffle plate 6 in the annular space 9 is also formed.

The flow, for example the electrolyte solution, leaves the annular space 9 outwards via the tube slots 10 in the distributor tube 1 with the same velocity and with the same internal pressure. The exit slots 8 are arranged offset in the casing tube 7 in the axial direction. The annular plates 11 present at the beginning or at the end of each flow chamber 4 center the volume flow distributor 2 with the distributor tube 1. The material of the whole inlet tube system of distributor tube 1, volume flow distributor 2, flow chambers 4, casing tube 7 and the other components is expediently made of acid-resistant plastic, such as, for example, polypropylene or polyvinyl chloride. The flow or liquid stream is introduced at one end into the distributor tube 1, and the partial streams in the individual flow chambers 4 are deflected transversely of the tube axis 13. Each of the deflected partial streams is uniformly distributed over the internal periphery of the distributor tube 1 before it exits from the tube slots 10 of the distributor tube 1.

A perspective view of a further embodiment, partially broken away, of the distributor tube 1 is represented in FIG. 4. The distributor tube 1 perforated by the tube slots 10 encloses a rotationally symmetrical pressure distributor 15, which is centered in the distributor tube 1 by ribs 17 in a star shape. The pressure distributor 15 has a diameter which increases from an inlet opening 23 for the fluid to an end face 24 of the distributor tube 1, and is joined directly to the end face 24. The liquid pressure in the interior of the tube is kept constant by the increasing diameter of the pressure distributor 15 within the distributor tube 1. The pressure distributor 15 consists of several pressure distributor stages 18, 19, 20, for example of cylindrical shape, connected together by frustroconical joints 16. The cylinder 18 nearest to the inlet opening 23 of the distributor tube 1 is occluded by a paraboloid of revolution 25. The pressure distributor 15 effects a uniform pressure distribution in the axial and radial flow directions. The individual pressure distributor stages can also have different shapes; for example, the pressure distributor stage 20 can be a conical frustrum, while the rest of the pressure distributor stages 18 and 19 are cylinders. An embodiment is likewise possible in which all of the pressure distributor stages consist of conical frustrums and are furthermore connected together by frustroconical joints 16. Here it is only of importance that the pressure distributor 15 is designed such that the pressure distribution is isobaric in the fluid flowing through or in the inflowing liquid, in the gap between the interior of the distributor tube 1 and the shell surfaces of the pressure distributor stages or the shell surface of the whole pressure distributor 15. As can be seen from the sectional representation of FIG. 5, the flow or the liquid emerges radially from the tube slots 10 of the distributor tube 1 with uniform internal pressure or uniform velocity.

EMBODIMENT EXAMPLE

For a lateral introduction of a liquid into the distributor tube 1, e.g., 225 m³/h, the tube can have the following dimensions, which provide sufficiently for a torsion-free and uniform distribution over the tube axis of the perforated distributor tube 1:

| Internal diameter | 200 mm |
| Length | 1,690 mm |
| Wall thickness | 12 mm |
| Length of the tube slots 10 | 74 mm |
| Width of the tube slots | 3 mm |
| Spacing of the tube slots | 16 mm |

The tube slots 10 are arranged in the peripheral surface of the distributor tube 1, in rows transversely of the tube axis.

Dimensions of a 4-stage pressure distributor 15:

The length of the whole pressure distributor is 1,450 mm.

The pressure distributor 15 is attached at the rear end of the distributor tube 1.

Dimensions of the individual pressure distributor stages from the end face 24 to the inlet opening 23:

|  | Diameter | Length |
| --- | --- | --- |
| Pressure distributor stage 1 | 160 mm | 150 mm |
| Pressure distributor stage 2 | 110 mm | 600 mm |
| Pressure distributor stage 3 | 90 mm | 400 mm |
| Pressure distributor stage 4 | 63 mm | 300 mm |

The transitions from one pressure distributor stage to the other have the form of conical frustrums.

A further embodiment of a pressure distributor 21 is shown schematically in FIG. 6, where in this case the pressure distributor 21 is a one-piece paraboloid of revolution. For a given local length section k of the paraboloid of revolution at the point i there is an internal diameter $d_i$ according to the equation $$d_i^2 = d_0^2 + iD^2/n$$

where the number $n = L/k$ of the length sections k, $i = 0, 1, 2, 3 \ldots n$, a predetermined total length L of the pressure distributor 21, maximum internal diameter D of the distributor tube 1, or maximum external diameter of the pressure distributor 21, and a predetermined length of 10 mm for a length section k. In the above equation, $d_0$ is the smallest diameter of the pressure distributor 21 for $i = 0$, i.e., it has a value equal to 0 mm, when the numbering i of the successive length sections k is begun at the tip of the pressure distributor 21, and the numbering is continued in the direction of the maximum external diameter D of the pressure distributor 21, where i is a numerical sequence $0, 1, 2 \ldots n$.

The above equation for the local internal diameter $d_i$ follows from the equation $$d_i^2 - d_{i-1}^2 = D^2/n,$$

in which, for i becoming smaller, the respective corresponding value is newly inserted in this equation. There then results:

$$d_i^2 = D^2/n + d_{i-1}^2$$

$$d_{i-1}^2 = D^2/n + d_{i-2}^2$$

$$d_{i-(i-1)}^2 = D^2/n + d_{i-[(i-1)+1]}^2$$

$$d_i^2 = \underbrace{D^2/n + D^2/n + \ldots D^2/n}_{i \text{ times}} + d_0^2$$

$$d_i^2 = d_0^2 + iD^2/n.$$

With a sufficiently large number n of segments, the envelope of the displacement body can be constructed and made, given the local diameters $d_i$, obtained in this manner, of the paraboloid of revolution.

The dimensions are given below of a perforated distributor tube 1 and of a pressure distributor 21 as follows:

| Maximum internal diameter D | 143 mm |
| Pressure distributor length L | 1,400 mm |
| Wall thickness | 12 mm |
| Tube slot length | 74 mm |
| Tube slot width | 3 mm |
| Spacing of the tube slots | 16 mm |

The respective average internal diameter of a length section k of the paraboloid of revolution pressure distributor 21 is given by the following relation:

$$d_i^2 - d_{i-1}^2 = D^2/n$$

This relation gives for $n = 140$ ($n = $ length/k $= 1,400$ mm/10 mm $= 140$) the associated internal diameter $$d_i = \sqrt{146.0643 + d_{i-1}^2},$$

when the diameter in mm is inserted.

A further embodiment of a pressure distributor 22 is schematically shown in FIG. 7. A rotationally symmetrical cone is concerned here, of the length L of the pressure distributor and of maximum internal diameter D of the distributor tube 1 or the maximum external diameter of the pressure distributor 22. The pressure distributor 22, like the pressure distributor 21 of FIG. 6, is also fitted to the inner side of the end face 24 (cf. FIG. 4). The pressure distribution within the distributor tube 1 on insertion of a purely conical pressure distributor 22 deviates slightly from the uniform pressure distribution when a pressure distributor 21 is used which is strictly a paraboloid of revolution, but this slight nonuniformity of the pressure distribution lies within the tolerance limits for practical operation. The advantage of the purely conical pressure distributor 22 as against the pressure distributor 21 which is a paraboloid of revolution is that it is easier to make.

What is claimed is:

1. A process for the uniform introduction of a fluid into a fluid bath by means of a distributor tube which is perforated over its shell surface, comprising the steps of:
    a) introducing a fluid stream into said distributor tube at one end side,
    b) guiding the fluid streams longitudinally in a gap between the distributor tube and a rotationally symmetrical pressure distributor,
    wherein the fluid pressure in the interior of said distributor tube is kept constant by an increasing diameter of said pressure distributor from said one end side to an end face of the distributor tube such that a uniform pressure distribution in the axial and radial flow directions is obtained in the fluid streams flowing through the gap in the distributor tube.

2. A process as claimed in claim 1, wherein the fluid emerging from the perforated shell surface of said distributor has a uniform velocity and uniform internal pressure.

3. A process as claimed in claim 1, wherein said fluid stream comprises a liquid or a gas.

4. A process as claimed in claim 3, wherein said fluid stream comprises a liquid selected from the group consisting of electrolyte solutions.

5. An apparatus for uniform distribution of a fluid into a fluid bath comprising a distributor tube perforated over its shell surface and enclosing thereby a rotationally symmetrical pressure distributor which is centered in the distributor tube by ribs in a star-shaped manner such that a gap is formed between an interior surface of the distributor tube and a shell surface of the pressure distributor, wherein the diameter of said pressure distributor increases from an inlet opening to an end face of the distributor tube, and is joined to said end face.

6. An apparatus as claimed in claim 5, wherein the pressure distributor comprises a plurality of pressure distributor stages, wherein the pressure distributor stages are cylindrical and are connected together by frustroconical joints, and wherein the cylinder nearest to the inlet opening is occluded by a paraboloid of revolution.

7. An apparatus as claimed in claim 5, wherein the pressure distributor is designed such that the pressure distribution is isobaric in the inflowing fluid in the gap between the interior of the distributor tube and the shell surface of the pressure distributor.

8. An apparatus as claimed in claim 5, wherein the pressure distributor consists of a one-piece paraboloid of revolution, of which the internal diameter associated with a given length section k is determined by the equation $d_i^2 = d_0^2 + iD^2/n$, with the number $n = L/k$ of the length sections k, and with a predetermined total length L, maximum internal diameter D, a predetermined length of a length section k of 10 mm, wherein the index i is an integer assuming values from 0 to n.

9. An apparatus as claimed in claim 5, wherein the rotationally symmetrical pressure distributor is a cone.

10. An apparatus as claimed in claim 5, wherein said distributor tube, pressure distributor, and ribs are constructed of a plastic.

11. An apparatus as claimed in claim 10, wherein said plastic is selected from the group consisting of polypropylene and polyvinyl chloride.

12. An apparatus as claimed in claim 5, wherein said pressure distributor comprises a plurality of pressure distributor stages.

13. An apparatus as claimed in claim 12, wherein said stages are each conical frustums connected together by frustoconical joints.

14. An apparatus as claimed in claim 12, wherein said stages have different shapes.

15. An apparatus as claimed in claim 14, wherein said stages comprise a combination of conical frustums and cylinder shaped stages.

16. An apparatus as claimed in claim 12, wherein said stages are in the form of conical frustums or cylinder-shaped stages.

17. An apparatus as claimed in claim 5, wherein said pressure distribution comprises a one-piece paraboloid of revolution.

* * * * *